United States Patent [19]

Solie

[11] Patent Number: 4,908,542
[45] Date of Patent: * Mar. 13, 1990

[54] SAW TAPERED TRANSDUCERS

[75] Inventor: Leland P. Solie, Mahomet, Ill.

[73] Assignee: Unisys, Blue Bell, Pa.

[*] Notice: The portion of the term of this patent subsequent to Jan. 6, 2004 has been disclaimed.

[21] Appl. No.: 65,748

[22] Filed: Jun. 24, 1987

[51] Int. Cl.$^4$ ............................................. H03H 9/145
[52] U.S. Cl. ........................... 310/313 B; 310/313 C; 333/154; 333/195
[58] Field of Search .................... 333/150-155, 333/193-196; 310/313 R, 313 A, 313 B, 313 C, 313 D

[56] References Cited

U.S. PATENT DOCUMENTS

| | | | |
|---|---|---|---|
| 3,568,102 | 3/1971 | Tseng | 333/153 |
| 3,727,718 | 4/1973 | Whitehouse | 333/154 X |
| 3,753,164 | 8/1973 | DeVries | 333/153 |
| 3,975,697 | 8/1976 | Paige | 310/313 D X |
| 4,126,800 | 11/1978 | Shiokawa et al. | 333/194 |
| 4,166,228 | 8/1979 | Solie | 310/313 D |
| 4,477,784 | 10/1984 | Maerfeld et al. | 333/154 |
| 4,521,751 | 6/1985 | Riha et al. | 333/151 |
| 4,635,008 | 1/1987 | Solie | 333/195 |
| 4,746,882 | 5/1988 | Solie | 333/196 |
| 4,749,971 | 6/1988 | Solie | 333/153 |

FOREIGN PATENT DOCUMENTS 938366  6/1982  U.S.S.R. ............................. 333/151

OTHER PUBLICATIONS

K. Yamanouchi and H. Furuyashiki, 1984 IEEE Ultrasonics Symposium, p. 70.

Primary Examiner—Eugene R. Laroche
Assistant Examiner—Benny T. Lee
Attorney, Agent, or Firm—Glenn W. Bowen; Robert S. Bramson

[57] ABSTRACT

A Surface Wave Acoustic (SAW) is constructed with hyperbolically curved electrode fingers. The transducers consist of relatively narrower inner electrode fingers and relatively wider outer electrode fingers, and may also be divided into a plurality of tracks with each of the tracks being subdivided into a plurality of subtransducer elements which are capacitively coupled in electrical series.

6 Claims, 5 Drawing Sheets

SAW TAPERED TRANSDUCERS

BACKGROUND OF THE INVENTION

The present invention relates to Surface Acoustical Wave (SAW) tapered transducers and a dispersive reflective array. The transducer is shown in conjunction with dispersive array that has an electrode pattern which reduces insertion loss and electrode resistance and which allows the electrodes to be connected in series electrically, in order to raise the acoustic impedance of the device.

Wide-band linear phase SAW filters using slanted finger transducers are described in "Wide Band Linear Phase SAW Filters Using Apodized Slanted Finger Transducers" by P. M. Naraine and C. K. Campbell in the 1983 IEEE Ultrasonic Symposium Proceedings, pages 113-116. The slanted finger interdigital transducer structure described in this article employed straight slanted fingers which emanated from a common focal point, in an effort to yield a flat amplitude response across a passband. Apodization of the device was derived from a computer optimization routine to compensate for the inherent negative amplitude slope of an unapodized slanted finger transducer, so that the external amplitude equalization circuits were not needed.

A subsequent article entitled "Improved Modeling of Wide-Band Linear Phase SAW Filters Using Transducers with Curved Fingers" by N. J. Slater and C. K. Campbell was published in the IEEE Transactions on Sonics and Ultrasonics, Vol. SU-31, No. 1 January 1984, pages 46-50. The authors of this work describe a wide band linear phase SAW filter in which slanted fingers such as those shown in the Naraine and Campbell article have been curved to obtain a flatter frequency response for delay line applications.

The present invention involves transducers with curved fingers which are, in particular, hyperbolically tapered in conjunction with a dispersive reflective array to provide an improved SAW dispersive filter. The transducers of the present invention also utilize configurations which reduce the insertion loss and allow for the acoustic impedance to be increased by a unique finger design.

A transducer constructed in accordance with this invention is shown in U.S. Pat. No. 4,635,008 issued Jan. 6, 1987 to the inventor of this invention which is assigned to the assignee of this invention, the Unisys corporation, the successor of the Sperry Corporation.

SUMMARY OF THE INVENTION

A hyperbolically tapered transducer is provided with fingers with electrode configuration paths which are subdivided into defined patterns in order to segment the acoustic beam width, and to subdivide the structure into a plurality of subtransducers.

BRIEF DESCRIPTION OF THE DRAWINGS

The present invention is illustrated by reference to the drawings in which.

TECHNICAL DESCRIPTION OF THE INVENTION

Figure 1:
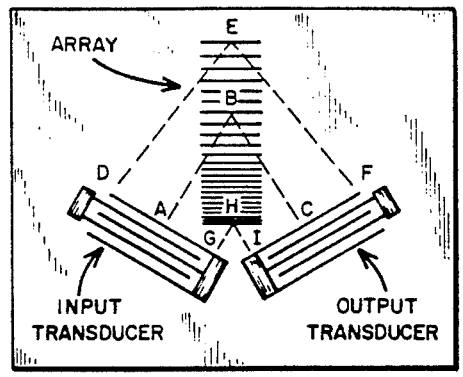
FIG. 1 is a representation of a prior art dispersive reflective SAW filter which employed input and output transducers of a constant periodicity.

Referring to the prior art of FIG. 1, there is shown therein a dispersive reflective array SAW filter in which transducers of a conventional type, with parallel interdigital electrode fingers, are employed as the input and output transducers. The dispersive reflective array consists of a number of parallel lines that may be formed either by depositing metal conductive strips, or by trenches or grooves, formed in the substrate on which the transducer array rests. Because of the constant spacing between the interdigital fingers of the transducers of FIG. 1, a relatively narrow band of frequencies will be generated by the input transducer and received by the output transducer.

The lines A, B, C represents a wave which passes from the input transducer at A to the reflective array at B and is then bounced off and supplied to the output transducer at C. This waveform represents a wave which is within the receiving band capabilities of the output transducer. The waves represented by the lines D, E, F and G, H, I are, respectively, too low and too high in frequency to be coherently reflected by the array. Only a small fraction of the acoustic beam aperture will be reflected toward the output transducer. As this narrow aperture beam arrives at the output transducer only a small fraction of its energy can be detected by the transducer because of the mismatch in beam widths. Thus, although all of the frequency spectrum of the wave that was generated by the input transducer was incident upon the entire reflective array, only a limited amount of the incident waveform is recovered by the output transducer. This results in an unacceptably large insertion loss.

Figure 2:
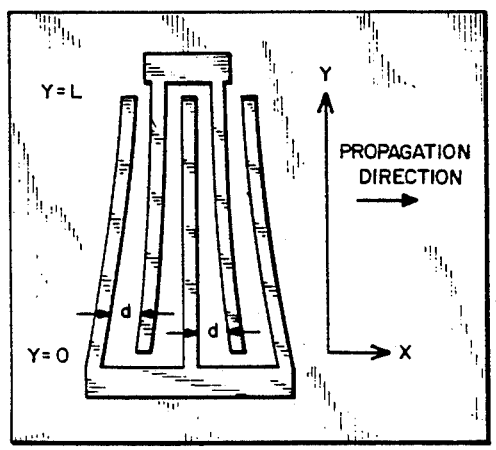
FIG. 2 is a representation of a prior art tapered transducer.

The prior art transducer illustrated in FIG. 2, is a tapered transducer with curved electrodes in which the spacings between the fingers of one electrode section and the fingers of the other electrode section is a function of the length, or Y, position along the fingers and is independent of the X, or propagation direction. Therefore, for each Y position the transducer will be phased matched, or resonant, with a SAW whose wavelength is equal to twice the distance d. The frequency of the SAW will, therefore, be equal to the velocity of the wave divided by 2d. The range of frequencies that may be launched by the transducer will, thus, range between the velocity of the wave, or V, divided by twice the maximum d; and he velocity of the wave divided ty twice the minimum d. As seen in FIG. 2 the maximum value of d occurs at Y=0, and the minimum value at Y=L. Different frequencies will then be launched at different points along the transducer in accordance with the value d across the length of the transducer at a given Y position.

The tapered electrode transducer of the present invention is constructed so that if the frequency of the transducer varies linearly with delay time, as it will for an FM filter, then the SAW frequencies will vary linearly across the transducer going from Y=0 to Y=L. Since the launched frequencies are proportional to their originating Y position, then Y will be proportional to 1/d. In other words, the electrode lines of the transducer of the present invention will be segments of hyperbolas for linear FM filter operations, and the frequency of the filter will vary linearly across the bandwidth.

Figure 3:
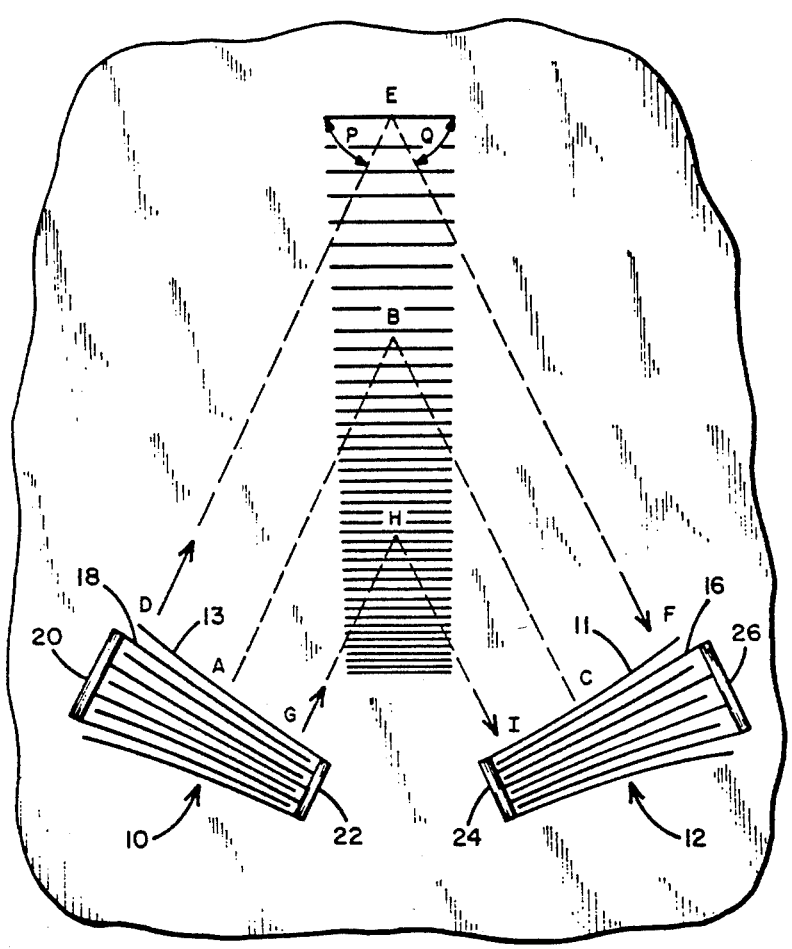
FIG. 3 is a representation of a dispersive SAW filter which employs a dispersive reflective array and hyperbolically tapered input and output transducers.

A combination of a hyperbolically tapered transducer and a dispersive reflective array constructed is shown in FIG. 3 in which the input transducer 10 and the output transducer 12 are aligned so that the angle of the incidence of the incoming waves from the input transducer 10, such as the angle P, will be equal to the angle of reflection, such as the angle Q, to the output transducer 12. As shown in the Figure, the distance between the fingers 13, which are attached to the short electrode 22, and the fingers 18, which are attached to the long electrode 20, are spaced closer together as they approach the short electrode and are spaced farther apart toward the long electrode.

The intermediate frequencies of the input transducer will thus be reflected from the dispersive array along the lines A, B, C to the output transducer in the manner of the prior art. However, in the filter of FIG. 3, because of the matching curvature of the input and output transducers, the low frequency waves will not be developed along the entire transducer but only along the proportion of the transducer which is proximate the longer electrode 20. The spacing of the fingers of the output transducer with respect to the short electrode 24 and the long electrode 26 of the output transducer 12 is matched with that of the input transducer 10. The lower frequency waves produced by the input transducer will, therefore, be reflected along the path D, E, F and will be received without substantial loss by the output transducer 12.

In a similar manner, the high frequency signal is generated in the vicinity of the shorter electrode 22 of the input transducer 10 and will be provided along the path G, H, I to the output transducer 12, where they are again received without substantial loss. Thus, the embodiment in FIG. 3 provides an improved dispersive filter with a lower loss and a wider bandwidth.

Figure 4:
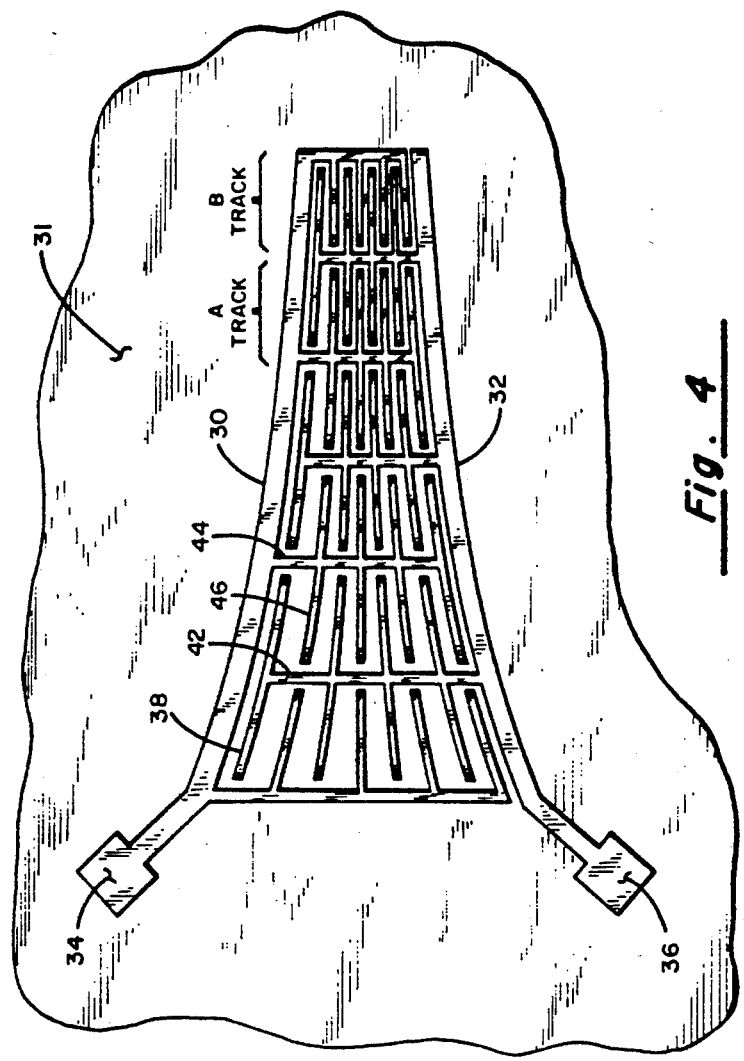
FIG. 4 illustrates an embodiment of a transducer constructed in accordance with the present invention.

FIG. 4 shows a modification to the basic transducers with hyperbolic shaped electrode fingers of FIG. 3 which may be utilized when it is necessary to further reduce the insertion loss for such transducers. This modification involves the segmenting of the fingers of the transducer so that only the two outer, widened electrode fingers 30 and 32, (on a suitable substrate 31, such as a piezoelectric acoustic-wave-propagating medium, or other substrate known to be suitable for the purpose) connect to the opposite electrode pads 34 and 36 respectively, and extend along the entire length of the transducer. The remaining inner electrodes, such as the electrodes 38 and 46, extend along only a portion of the outer fingers 30 and 32, and are connected to their respective outer fingers through crossbeams, such as the crossbeams 42, 44. By segmenting the inner electrode segments, and by increasing the width of the outer electrodes 30 and 32, a decrease in electrode resistance is obtained which allows the width of the inner electrodes to be sufficiently narrow to produce a transducer which does not have substantially different acoustic impedance than the transducer of FIG. 3. The electrical parasitic resistance, however, is approximately decreased by $N^2$ over this transducer, where N is the number of segments, such as the electrode 38 into which each finger electrode is divided. For example, in the embodiment shown in FIG. 4 where there are six segments, the electrode resistance will be approximately 1/36 of the resistance of the transducer shown in FIG. 3.

Figure 5:
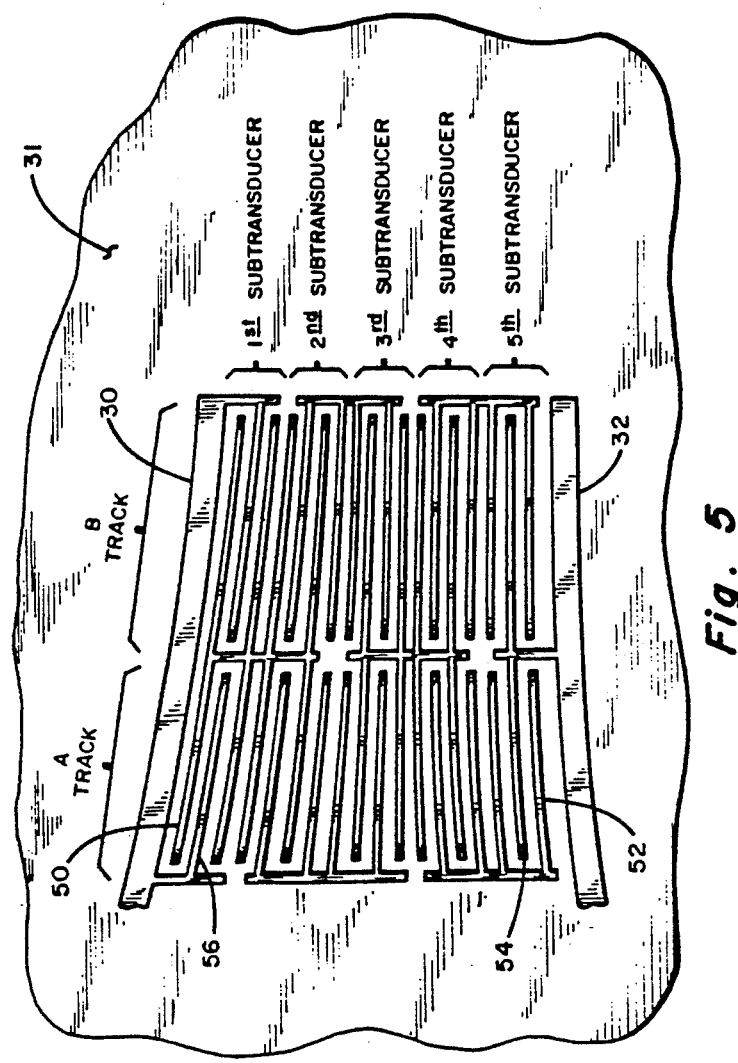
FIG. 5 illustrates a pair of segments of the transducer of FIG. 4, which form a further embodiment of the present invention.

FIG. 5 shows another modification in which each segment of the transducer may be subdivided to provide a number of subtransducers across the outer electrodes. The showing of FIG. 5, for simplification, illustrates only two tracks of the transducer, which correspond to the tracks between the lines A and B of FIG. 4. Interconnections in these tracks provides a number of capacitively coupled, floating electrode subtransducers. For example FIG. 5, there are five subtransducers in each track which are connected in series to provide a voltage dividing path between the electrodes 30, 32. For example, capacitive coupling occurs between sections 30 and 50, 32 and 52, 52 and 54, 50 and 56, etc., of FIG. 5. The acoustic impedance is increased by factor $N^2$, where N is the number of subtransducers of each track, over the acoustic impedance of the transducer of FIG. 4. Thus, in the illustrated embodiment of FIG. 5 the acoustic impedance is increased by a factor of 25, as compared to a transducer with the same number of electrodes but with only one subtransducer per segment as in FIG. 4.

Although changes and modifications may be proposed by those skilled in the art, all such changes or modifications that do not depart from the teachings of this invention are intended to be included within the scope of the invention.

Figure 6:
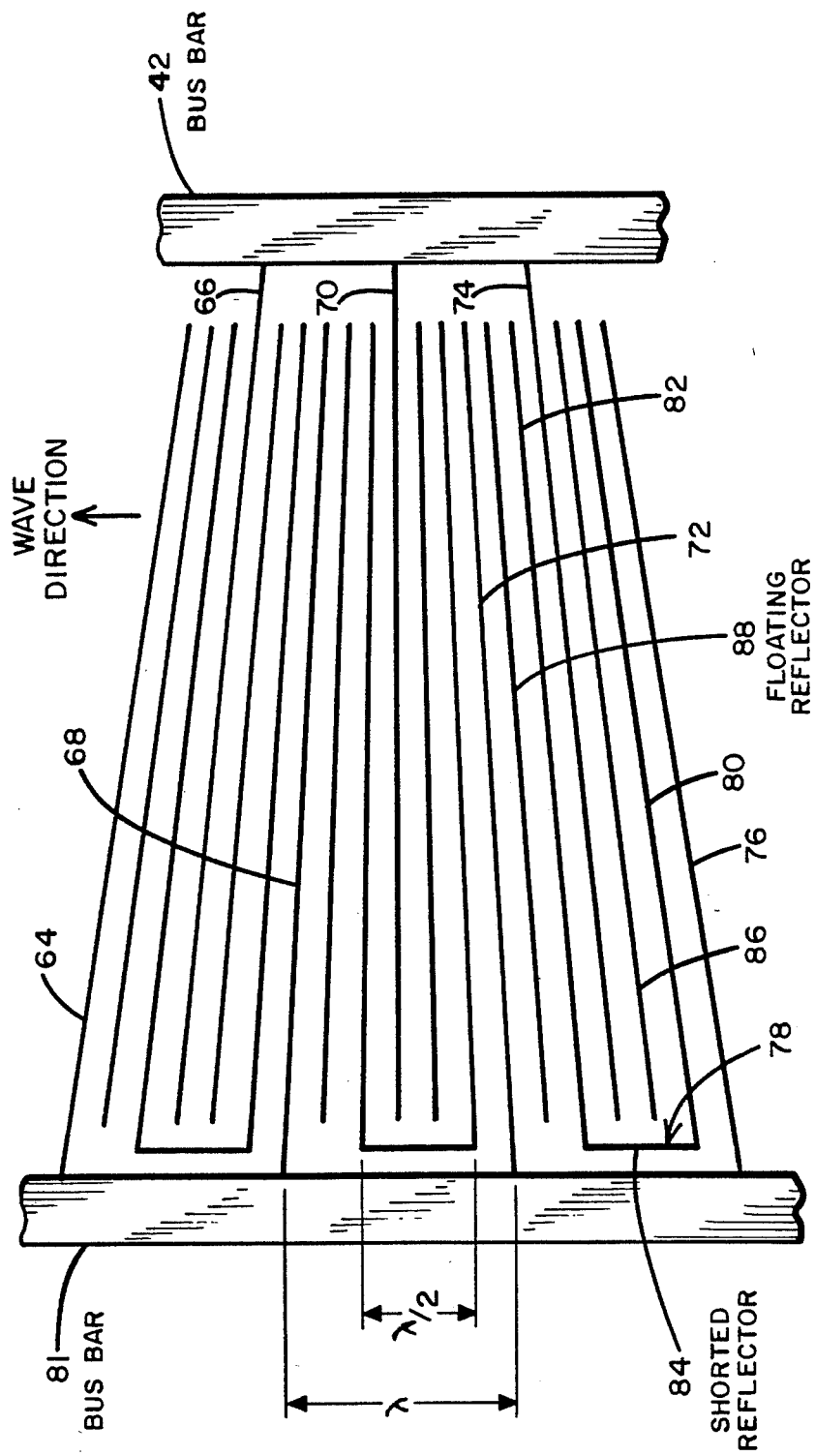
FIG. 6 shows a further modification of the transducer of the present invention which provides unidirectionality.

A further improvement in the transducer of FIG. may be provided by utilizing a modified version of the technique taught by Yamanouchi and Furuyashiki in 1984 IEEE Ultrasonics Symposium, page 70, to achieve better unidirectionality and less bidirectional loss. As shown in FIG. 6, this is achieved by inserting floating and shorted pair electrodes in each of the sections, such as the section 60. The elements 42, 62, 64, 66, 68, 70, 72, 74 and 76 of FIG. 4 correspond to similar elements in FIG. 6.

To improve unidirectionality shorted pair electrodes, such as the electrode pair 78 having two elongated electrodes 80, 82 and a shorting electrode 84 running therebetween, and floating electrodes, such as the elongated electrode 86 between the elements 80 and 82, and the elongated electrode 88, between the electrodes 72 and 82 are employed. The center-to-center spacing of the electrodes 80 and 82 is approximately one-half wavelength at any point along its length. The center-to-center spacing of the electrodes 72 to 88, 88 to 82, 82 to 74, 74 to 86, 86 to 80, and 80 to 76 are all approximately one-sixth of a wavelength at any point along its length.

I claim:

1. A Surface Acoustive Wave (SAW) transducer which comprises first and second electrodes, each of which comprise a plurality of interdigital electrode fingers positioned such that the spacing between said fingers varies from point-to-point along said transducer and the spacing between said fingers is substantially constant at any given point in order to provide a varying frequency response, wherein said interdigital electrode fingers comprise a pair of outer electrode fingers and a plurality of inner electrode fingers, said outer electrode fingers are relatively wider than said inner electrode fingers, said inner electrode fingers are subdivided into a plurality of sections, and said transducers comprise interconnection electrode connection means from connecting each of said sections to one of said outer electrode fingers, said outer electrode fingers being aligned generally normal to the paths of said surface acoustical waves as they are launched along said SAW transducer, and said inner electrode fingers comprising transducing segments which are also aligned generally normal to the path of said surface acoustical waves and linking segments which are aligned generally normal to said inner electrode transducing segments.

2. A SAW transducer as claimed in claim 1 wherein said transducer is divided into a plurality of tracks, and each of said tracks is subdivided into a plurality of sub-transducer elements which comprise floating electrode fingers which are not connected to either of said outer electrode fingers but which are configurated so they capacitively couple subtransducers that are in a given track in electrical series.

3. A SAW transducer as claimed in claim 1 wherein all of said electrode fingers are formed as segments of hyperbolic curves and the spacing between said fingers provides a linearly varying frequency response.

4. A SAW transducer as claimed in claim 3 wherein said transducer is divided into a plurality of tracks, and each of said tracks is subdivided into a plurality of sub-transducer elements which comprise floating electrode fingers which are not connected to either of said outer electrode fingers but which are configurated so they capacitively couple subtransducers that are in a given track in electrical series.

5. A SAW transducer as claimed in claim 2 wherein each subtransducer comprises elongated shorted pair electrodes separated by approximately one-half wavelength at any point along their lengths and joined together by a shorting electrode and a pair of floating electrodes separated by approximately one-half wavelength at any point along their lengths interspersed with said inner electrode fingers in a repetitive pattern to provide unidirectionality of SAW waves from said transducer.

6. A SAW transducer as claimed in claim 5 wherein all of said electrode fingers are formed as segments of hyperbolic curves and the spacing between said fingers provides a linearly varying frequency response.

* * * * *

UNITED STATES PATENT AND TRADEMARK OFFICE
CERTIFICATE OF CORRECTION

PATENT NO. : 4,908,542
DATED : March 13, 1990
INVENTOR(S) : Leland P. Solie

It is certified that error appears in the above-identified patent and that said Letters Patent is hereby corrected as shown below:

IN THE PRINTED PATENT

Column 5, line 3, delete "from" and substitute -- for -- .

Signed and Sealed this

Eleventh Day of December, 1990

Attest:

HARRY F. MANBECK, JR.

*Attesting Officer*   *Commissioner of Patents and Trademarks*